(12) United States Patent  
Deng et al.

(10) Patent No.: US 8,654,562 B2  
(45) Date of Patent: Feb. 18, 2014

(54) STATIC RANDOM ACCESS MEMORY CELL WITH SINGLE-SIDED BUFFER AND ASYMMETRIC CONSTRUCTION

(75) Inventors: Xiaowei Deng, Plano, TX (US); Wah Kit Loh, Richardson, TX (US); Anand Seshadri, Richardson, TX (US); Zhonghai Shi, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 13/477,901

(22) Filed: May 22, 2012

(65) Prior Publication Data

US 2013/0182490 A1 Jul. 18, 2013

Related U.S. Application Data

(60) Provisional application No. 61/587,461, filed on Jan. 17, 2012, provisional application No. 61/595,717, filed on Feb. 7, 2012.

(51) Int. Cl.  
*G11C 11/00* (2006.01)

(52) U.S. Cl.  
USPC ............ 365/148; 365/158; 365/163; 438/238

(58) Field of Classification Search  
USPC .................. 365/148, 158, 163, 171; 438/238  
See application file for complete search history.

(56) References Cited

U.S. PATENT DOCUMENTS

| | | |
|---|---|---|
| 6,240,027 B1 | 5/2001 | Lee et al. |
| 2007/0279966 A1 | 12/2007 | Houston |
| 2009/0175069 A1 | 7/2009 | Houston |
| 2009/0179692 A1* | 7/2009 | Hidaka ........................ 327/537 |
| 2009/0219746 A1 | 9/2009 | Bosmuller et al. |
| 2011/0261609 A1 | 10/2011 | Seshadri |
| 2012/0063205 A1* | 3/2012 | Matsuzaki et al. ............ 365/149 |

OTHER PUBLICATIONS

Drennan et al., "Implications of Proximity Effects for Analog Design", Paper 8.6, Custom Integrated Circuits Conference (IEEE, 2006), pp. 169-176.

U.S. Appl. No. 13/154,225, filed Jun. 6, 2011, entitled "Asymmetric Static Random Access Memory Cell with Dual Stress Liner".

* cited by examiner

*Primary Examiner* — Son Dinh  
*Assistant Examiner* — Hien Nguyen  
(74) *Attorney, Agent, or Firm* — Rose Alyssa Keagy; W. James Brady; Frederick J. Telecky, Jr.

(57) ABSTRACT

Balanced electrical performance in a static random access memory (SRAM) cell with an asymmetric context such as a buffer circuit. Each memory cell includes a circuit feature, such as a read buffer, that has larger transistor sizes and features than the other transistors within the cell, and in which the feature asymmetrical influences the smaller cell transistors. For best performance, pairs of cell transistors are to be electrically matched with one another. One or more of the cell transistors nearer to the asymmetric feature are constructed differently, for example with different channel width, channel length, or net channel dopant concentration, to compensate for the proximity effects of the asymmetric feature.

5 Claims, 6 Drawing Sheets

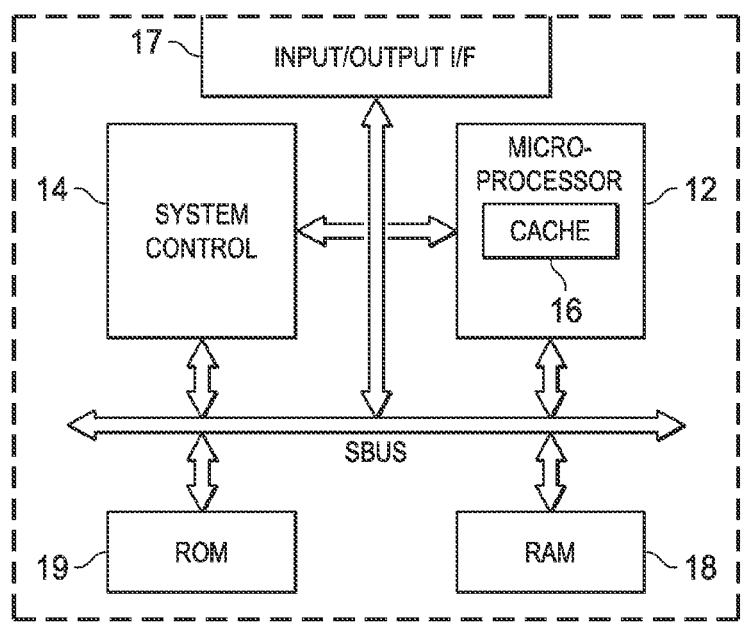
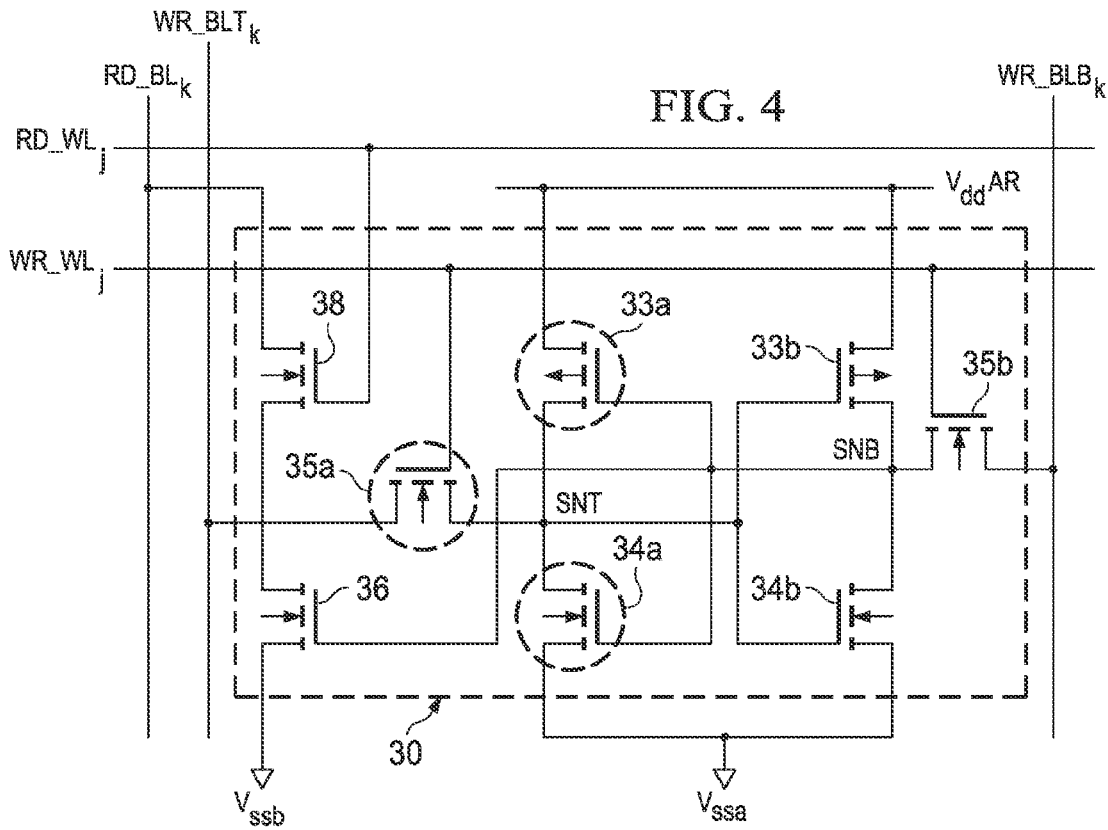

STATIC RANDOM ACCESS MEMORY CELL WITH SINGLE-SIDED BUFFER AND ASYMMETRIC CONSTRUCTION

CROSS-REFERENCE TO RELATED APPLICATIONS

This application claims priority, under 35 U.S.C. §119(e), of Provisional Application No. 61/587,461, filed Jan. 17, 2012; and of Provisional Application No. 61/595,717, filed Feb. 7, 2012, both incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuits, such as those including solid-state memory. Embodiments of this invention are more specifically directed to static random access memory (SRAM) cells and devices.

Many modern electronic devices and systems now include substantial computational capability for controlling and managing a wide range of functions and useful applications. Considering the large amount of digital data often involved in performing the complex functions of these modern devices, significant solid-state memory capacity is now commonly implemented in the electronic circuitry for these systems. Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM but also in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written, or retain a stored data state, as expected.

FIG. 1a illustrates an example of conventional SRAM cell, which is constructed in the well-known six-transistor (6-T) arrangement. In this example, cell 2 is in the $j^{th}$ row and $k^{th}$ column of a memory array of similar cells. SRAM memory cell 2 is biased between the voltage on power supply line $V_{dda}$ and a ground reference voltage $V_{ssa}$. SRAM memory cell 2 is constructed in the conventional manner as a pair of cross-coupled CMOS inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass transistor 5a has its source/drain path connected between storage node SNT and bit line $BLT_k$ for the $k^{th}$ column, and n-channel pass transistor 5b has its source/drain path connected between storage node SNB and bit line $BLB_k$. The gates of pass transistors 5a, 5b are driven by word line $WL_j$ for this $j^{th}$ row in which cell 2 resides.

In its normal operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$ to then float during the remainder of the access cycle. To access cell 2 for a read operation, word line $WL_j$ is then energized, turning on pass transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

One type of failure mechanism observed for SRAM cells such as cell 2 is a cell stability failure, also referred to as a "disturb" failure or as insufficient static noise margin, in which noise of sufficient magnitude coupling to the bit lines of unselected cells, for example during a write to a selected memory cell in the same row, can cause a false write of data to unselected cells in that same row. In effect, such noise can be of sufficient magnitude as to trip the inverters of one or more of the unselected cells (i.e., the "half-selected" cells in unselected columns of the selected row). Cell stability failures can occur in cases in which the drive of the SRAM cell driver or load transistors is mismatched relative to other transistors in the cell. For example, if cell 2 of FIG. 1a is storing a "0" data state (storage node SNT at a low level), weakness of one or both of the "on" state driver transistor 4a and load transistor 3b relative to the "off" state driver transistor 4b and load transistor 3a causes the latch of cell 2 to more easily change state when pass transistors 5a, 5b are is turned on during an access to its row j. More specifically, the "trip" voltage of cell 2 for the "0" to "1" transition will be higher than desired due to this relative weakness of transistors 3b, 4a, causing the state of cell 2 to "flip" in response to a smaller voltage drop at storage node SNT than would be required for the balanced cell. In other words, the stability of cell 2 to noise, such as that encountered when "half-selected", is reduced by this transistor imbalance.

Another failure mechanism of SRAM cells is a write failure, which occurs when an addressed SRAM cell does not change its stored state in response to a write of the opposite data state from that stored. Write failures are the converse of cell stability failures—while a cell stability failure occurs if a cell changes its state too easily, a write failure occurs if a cell is too stubborn in changing its state, specifically by the write circuitry being unable to pull down the storage node that is currently latched to a high voltage.

For example, if cell 2 of FIG. 1a is initially storing a "0" data state (storage node SNB at a high level, with load transistor 3b on and driver transistor 4b off), the opposite "1" data state will be written by a low level driven at bit line $BLB_k$ by write circuitry, and coupled to storage node SNB via the "on" state pass transistor 5b. Weakness of pass transistor 5b reduces the ability of the low-side bit line $BLB_k$ to overcome the opposing drive of load transistor 3b, leading to failure of this write cycle to change the cell state. Weakness of driver transistor 4b reduces the feedback effect from storage node SNT being pulled high by load transistor 3a (as driver transistor 4b begins to turn on due to the low level at bit line $BLB_k$) in this write operation, further reducing the writeability of cell 2. Weakness of load transistor 3a will also be reflected in weaker pulling high of storage node SNT, further reducing the feedback effect in this write cycle. The likelihood of write failure is thus increased by such device imbalance.

Accordingly, as well known in the art, balance in the electrical characteristics of load transistors 3a, 3b in the same SRAM cell relative to one another, and between driver transistors 4a, 4b in the same cell relative to one another, is conducive to both cell stability and writeability. As such, conventional SRAM cells are typically formed so that load transistors 3a, 3b match one another in construction as closely as possible, so that driver transistors 4a, 4b match one another in construction as closely as possible, and so that pass transistors 5a, 5b match one another in construction as closely as possible. This close matching of construction (i.e., matching in layout and also in dopant profiles and film thicknesses) between these paired transistors is designed to result in closely matched electrical characteristics of those paired devices.

Electrical effects dependent on the proximity and structure of neighboring devices have been observed in transistors constructed with deep sub-micron feature sizes (e.g., gate widths of 90 nm and below). Various causes and manifestations of these "proximity" effects have been characterized. These various proximity effects have been observed to impart significant variations in drain-to-source current of MOS transistors.

One known type of proximity effect involves the extent to which the photolithographic patterning of a polysilicon gate structure is affected by other nearby gate structures. Regularity in gate spacing and width is known to reduce variation due to these lithographic proximity effects. Lithographic proximity effects have also been observed at the contact level. In addition, nearby contact openings in overlying insulator films have been observed to affect strain effects in MOS transistors, depending on the stresses (i.e., compressive or tensile properties) in that overlying film.

As described in Drennan et al., "Implications of Proximity Effects for Analog Design", Paper 8.6, *Custom Integrated Circuits Conference* (IEEE, 2006), another source of strain-related proximity effects on MOS transistors is referred to as the Shallow Trench Isolation stress effect. Strain variation due to this effect results from stresses within the shallow trench isolation structures that define active regions (e.g., source and drain regions) of MOS transistors. As known in the art, relatively thick isolation dielectric (e.g., silicon dioxide) structures at selected surface locations of the integrated circuit define semiconductor active regions into which MOS transistors and other semiconductor circuit elements are formed. In modern integrated circuits, particularly those in the sub-micron regime, this isolation dielectric is formed by a masked recess etch into the surface of the substrate (or silicon layer in a silicon-on-insulator environment), followed by deposition of a dielectric film such as silicon dioxide into those recesses. The deposited silicon dioxide in these "shallow trench isolation" structures can exhibit compressive or tensile properties, which can impart strain to the neighboring active regions including MOS transistor channel regions. The extent of this imparted strain has been observed to depend on the proximity of the transistor to the shallow trench isolation structure, as well as the volume of the isolation dielectric itself (i.e., the proximity and size of a neighboring active region on the other side of the isolation structure).

By way of further background, recent advances in semiconductor technology as applied to integrated circuits include the use of "strain engineering" (or, alternatively, "stress engineering") in the manufacture of semiconductor device structures. This technology "tunes" strain in the crystal lattice of MOS transistor channel regions to enhance carrier mobility in those regions, which increases the source/drain current (i.e., drive strength) of the transistor in both the triode and saturation regions. In a general sense, compressive stress enhances hole mobility in the channel region of a p-channel MOS transistor, and tensile stress enhances electron mobility in the channel region of an n-channel MOS transistor. Known approaches in accomplishing this tuning include the use of "embedded SiGe" (or "eSiGe"), in which the source and drain regions of a p-channel MOS transistor structure are etched from the silicon substrate or well region, and are replaced with a silicon-germanium alloy formed by selective epitaxy. The germanium atoms within the silicon crystal lattice cause the eSiGe alloy to exhibit a larger lattice constant, thus applying compressive stress to the channel region of the p-channel MOS transistor. Another conventional strain engineering approach known as "dual stress liner", or "DSL", technology involves the formation of a silicon nitride layer of tensile or compressive characteristics over the active regions (i.e., source and drain regions) of n-channel and p-channel MOS transistors, respectively. However, it has been observed that the effects of these strain engineering techniques often extend to neighboring devices and structures, amounting to another type of "proximity effect".

Another proximity effect that has been observed in sub-micron integrated circuits is the cross-diffusion of implanted dopant species. If source/drain regions of neighboring or nearby transistors are formed by ion implantation at different doses, the resulting dopant concentration gradient may be sufficient to cause dopant ions to diffuse from a more heavily-doped source/drain region to a nearby more lightly-doped source/drain region. This of course can cause deviation from design for either or both of the affected transistors.

As known in the art, memory arrays involve a relatively large area of similar structures (i.e., the memory cells), and as such are conducive to being constructed in very regular fashion. This regularity in construction will, theoretically, reduce variation in array transistor performance due to proximity effects. This constraint can be enforced well in memory arrays in which all of the transistors are of substantially the same size, such as arrays of 6-T SRAM cells such as described above relative to FIG. 1a. Memory cells at the edges of the array can be protected from proximity effects and cross-diffusion by the construction of "dummy" memory cells around the edges of the memory array. These dummy cells are constructed similarly as the memory cells themselves, but without electrical connection.

Other types of integrated circuit functions that are also constructed as an array or region of repetitive device structures, similarly suffer from device variations due to proximity effect. For example, many modern logic circuits are constructed as a "sea of gates" or another type of repetitive construction at lower levels in the integrated circuit structure. These logic circuits can be readily customized to realize a particular logic function at upper structural levels, such as in the routing of metal conductors to the transistors and gates. Proximity effects similarly result in transistor performance variation between transistors and gates at the edges of the repetitive structures, and those in the interior of the logic array.

By way of further background, SRAM cells of the cross-coupled inverter latch type that have an additional read buffer are known in the art. FIG. 1b illustrates an example of such an SRAM cell 2', which adds a two-transistor buffer to the 6-T construction described above in connection with FIG. 1a. In this example, "8-T" SRAM cell 2' includes a single-sided read buffer constructed of n-channel MOS transistors 6, 8 with their source/drain paths connected in series between read bit line RD_BL$_k$ for column k in which cell 2' resides, and a ground voltage V$_{ssb}$ (which may be at the same or a different voltage from array ground voltage V$_{ssa}$). The gate of transistor 6 is connected to storage node SNB, while the gate of transistor 8 is connected to read word line RD_WL$_j$, which is the word line asserted in read cycles for row j in which cell 2' resides. Conversely, the gates of pass transistors 5a, 5b of cell 2' are connected to write word line WR_WL$_j$, and the source/drain paths of pass transistors 5a, 5b are connected between their respective storage nodes SNT, SNB, and write bit lines WR_BLT$_k$, WR_BLB$_k$, respectively. As such, the state of cell 2' appears at read bit line RD_BL$_k$ in a read cycle selecting cell 2', and is written from write bit lines WR_BLT$_k$, WR_BLB$_k$ in a write cycle selecting cell 2'.

Typically, 8-T SRAM cells such as cell 2' of FIG. 1b are implemented in those situations in which additional read current is to be sourced from the cell, beyond that which may be available from latch driver transistors 4a, 4b. More specifically, the 8-T cell is attractive in those designs in which cell transistors 3, 4 are to be fabricated as minimum feature size devices to attain high density and easy writeability, but in which the read current from those small devices is sub-optimal for the sense circuitry. As such, buffer transistors 6, 8 are generally constructed to be much larger (i.e., with relatively large channel widths) than latch transistors 3, 4, and pass transistors 5. In order for each cell 2' to be constructed with its own read buffer, these larger transistors must necessarily be placed within the same "bit cell" layout in the array, thus interspersing the larger buffer devices among the smaller (e.g., minimum feature size) latch and pass transistors of the cells.

However, as discussed above, the incorporation of larger buffer transistors adjacent or nearby to the smaller transistor can give rise to proximity effects and cross-diffusion effects. As a result, conventional 8-T SRAM cells 2' are able to provide improved read current, but at a price of potential imbalance in the operation of the latch portion of the cells 2'. These effects are particularly noticeable with memories constructed with the deep sub-micron transistor sizes now common in modern integrated circuits.

By way of further background, 6-T cells with asymmetrically constructed pass transistors are known in the art. In these conventional asymmetric cells, referring to FIG. 1a, pass transistors 5a, 5b have source regions (i.e., at the side connecting to bit lines BLT$_k$, BLB$_k$, respectively) that are constructed differently from their drain regions (i.e., at the side connecting to storage nodes SNT, SNB). The asymmetry is implemented so that the source/drain current is stronger for write operations (i.e., for discharging one of storage nodes SNT, SNB to the corresponding low level bit lines BLT$_k$, BLB$_k$) than for read operations (i.e., for pulling one of precharged bit lines BLT$_k$, BLB$_k$ to the lower level storage node SNT, SNB). This pass gate asymmetry can be accomplished by asymmetric source-side "halo" implantation at a large angle from the normal, for example with the gate electrode shadowing the implant on the drain side, in the formation of the source/drain regions of pass transistors 5a, 5b.

By way of further background, the construction of unmatched pass transistors in 6-T SRAM cells is also known in the art. According to this conventional approach, one bit line serves as a "read bit line" and the other serves as a "write bit line". The pass transistor coupled to the "read bit line" is constructed to have stronger drive than the pass transistor coupled to the "write bit line", for example by having a larger channel width, to provide a strong read current and thus a short access time. The weaker pass transistor for the "write bit line" can be of minimum feature size (i.e., smaller channel width) since the write mechanism can extend over the full cycle and is thus not as timing-critical as the read access time.

BRIEF SUMMARY OF THE INVENTION

Embodiments of this invention provide a memory array in an integrated circuit, and a method of fabricating the same, in which each memory cell in the array includes an asymmetric feature such as a large drive buffer while maintaining electrical balance.

Embodiments of this invention provide such a memory array and method in which each memory cell includes cross-coupled inverters constructed of minimum feature size transistors.

Embodiments of this invention provide such a memory array and method in which the memory cells are arranged in rows and columns, each including an asymmetric feature consisting of a read buffer, the read buffers for the cells in the same column aligned along one side of the column of cells.

Other objects and advantages of embodiments of this invention will be apparent to those of ordinary skill in the art having reference to the following specification together with its drawings.

An embodiment of the invention may be implemented in a memory cell having a cross-coupled inverter latch that is realized in an integrated circuit adjacent to an asymmetric feature associated with the cell having one or more transistors of larger physical size and construction than transistors of the latch of the cell. One or more of the transistors in the cell nearer the asymmetric feature are constructed to have different physical characteristics relative to counterpart transistors in that cell, to compensate for the effect of the asymmetric feature on the transistor electrical characteristics in the nearer inverter.

BRIEF DESCRIPTION OF THE SEVERAL VIEWS OF THE DRAWING

FIG. 2 is an electrical diagram, in block form, of an integrated circuit including one or more memory resources suitable for testing according to embodiments of this invention.

FIG. 4 is an electrical diagram, in schematic form, of a memory cell constructed according to embodiments of the invention.

DETAILED DESCRIPTION OF THE INVENTION

Figure 1A:
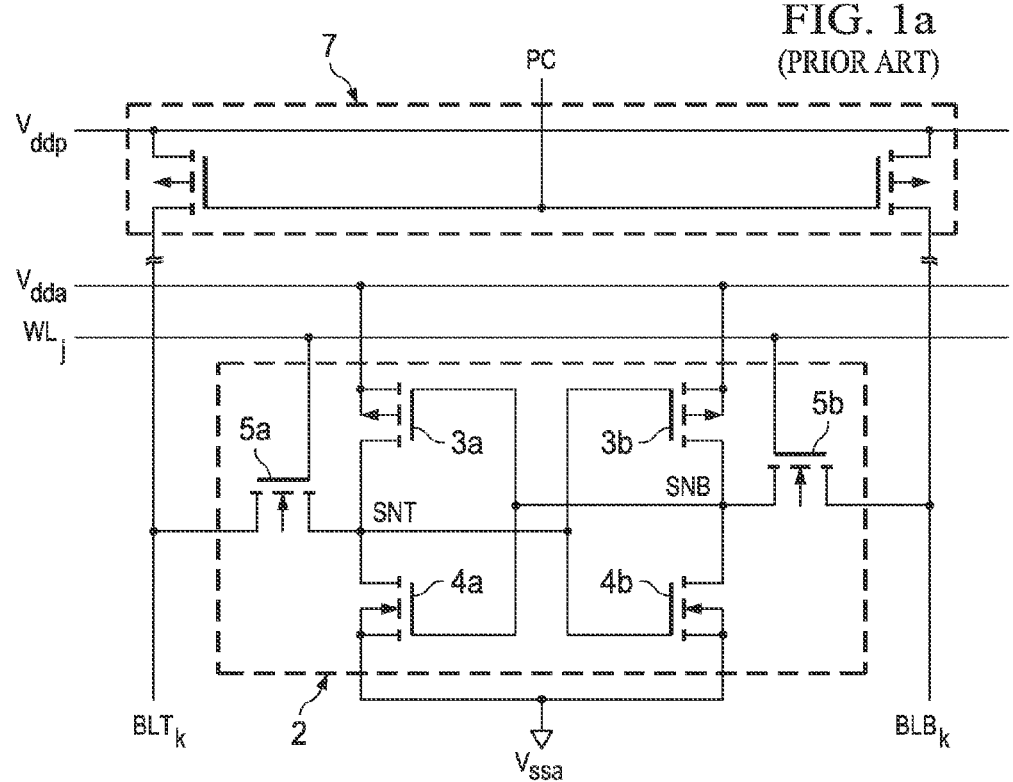
FIGS. 1a and 1b are electrical diagrams, in schematic form, of conventional SRAM cells.

This invention will be described in connection with one or more of its embodiments, namely as implemented into static random access memory (SRAM) cells of the complementary metal-oxide-semiconductor (CMOS) type, as it is contemplated that this invention is especially beneficial when implemented in that context. In particular, embodiments of this invention will be described using the example of eight-transistor ("8-T") SRAM cells. However, it is also contemplated that this invention can provide benefit in other circuit and structure applications, including without limitation memory cells that have other types of asymmetric read and write buffers, or that include transistors that are otherwise are vulnerable to asymmetric contexts. Accordingly, it is to be understood that the following description is provided by way of example only, and is not intended to limit the true scope of this invention as claimed.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and read-only memory (ROM) 19, reside on system bus SBUS and are thus accessible to microprocessor 12. In many modern implementations, ROM 19 is realized by way of electrically erasable programmable read-only memory (EEPROM), a common type of which is referred to as "flash" EEPROM. As will be described in further detail below, realization of at least part of ROM 19 as flash EEPROM can facilitate the implementation and operation of embodiments of this invention. In any case, ROM 19 typically serves as program memory, storing the program instructions executable by microprocessor 12, while RAM 18 serves as data memory; in some cases, program instructions may reside in RAM 18 for recall and execution by microprocessor 12. Cache memory 16 (such as level 1, level 2, and level 3 caches, each typically implemented as SRAM) provides another memory resource, and resides within microprocessor 12 itself and therefore does not require bus access. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

Figure 3:
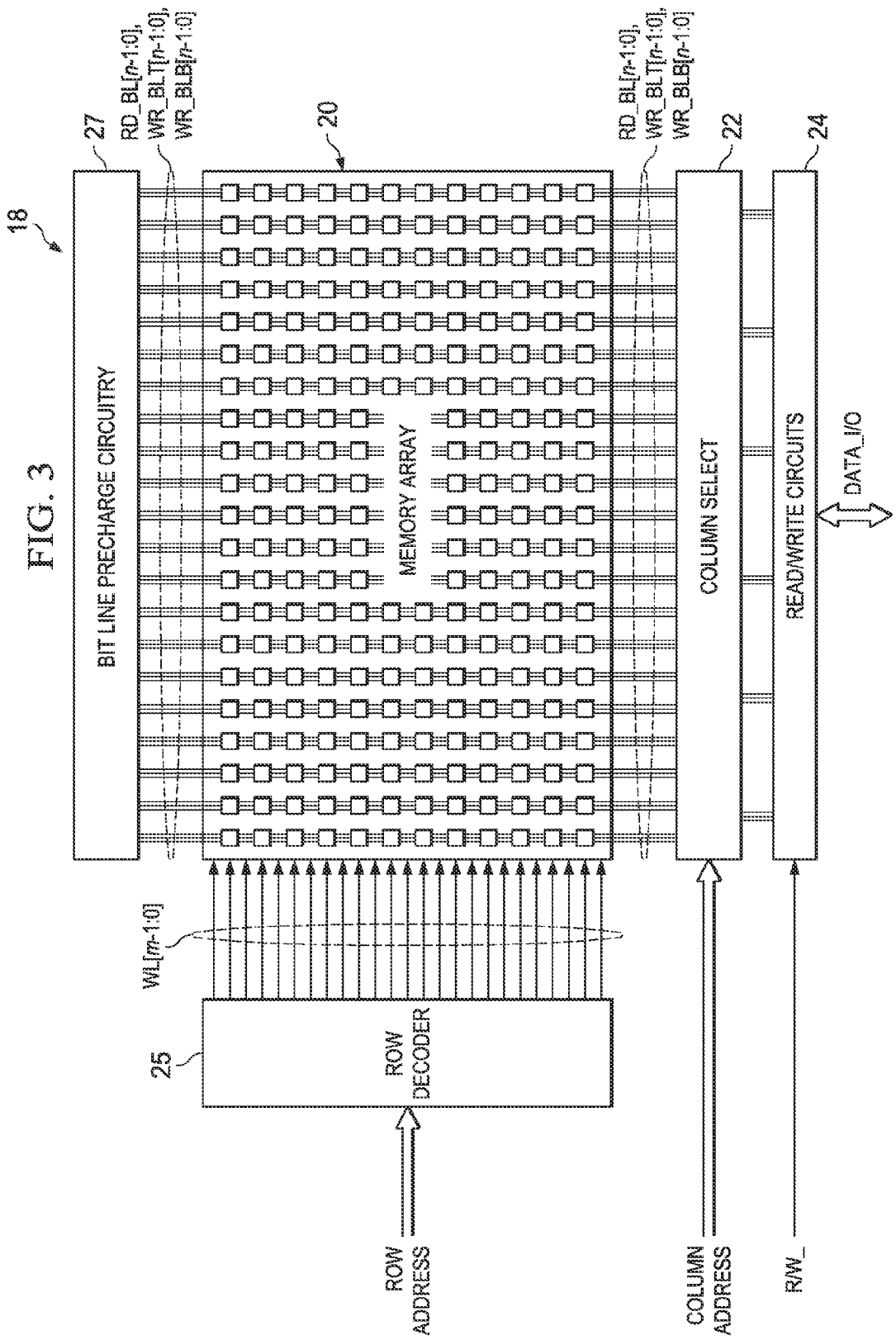
FIG. 3 is an electrical diagram, in block form, of a memory in the integrated circuit of FIG. 2 according to embodiments of this invention.

Further detail in connection with the construction of RAM 18 in integrated circuit 10 is illustrated in FIG. 3. Of course, a similar construction may be used to realize other memory resources such as cache memory 16; further in the alternative, RAM 18 may correspond to a stand-alone memory integrated circuit (i.e., rather than as an embedded memory as shown in FIG. 2). Those skilled in the art having reference to this specification will comprehend that the memory architecture of RAM 18 in FIG. 3 is provided by way of example only.

In this example, RAM 18 includes many memory cells arranged in rows and columns within memory array 20. While a single instance of memory array 20 is shown in FIG. 3, it is to be understood that RAM 18 may include multiple memory arrays 20, each corresponding to a memory block within the address space of RAM 18. In the example shown in FIG. 3, memory array 20 includes m rows and n columns of "8-T" SRAM cells, with cells in the same column sharing a read bit line RD_BL[n−1:0], a pair of write bit lines WR_BLT[n−1:0], WR_BLB[n−1:0], and with memory cells in the same row sharing one of word lines WL[m−1:0]. Bit line precharge circuitry 27 is provided to apply a desired precharge voltage to bit lines RD_BL[n−1:0], WR_BLT[n−1:0], WR_BLB[n−1:0] in advance of read and write operations. Row decoder 25 receives a row address value indicating the row of memory array 20 to be accessed, and energizes the one of word lines WL[m−1:0] corresponding to that row address value. Column select circuit 22 receives a column address value, and in response selects bit lines RD_BL[n−1:0], WR_BLT[n−1:0], WR_BLB[n−1:0] associated with one or more columns to be placed in communication with read/write circuits 24. Read/write circuits 24 are constructed in the conventional manner, for example to include the typical sense amplifier coupled to the read bit lines RD_BL[n−1:0] for a column as selected by column select circuit 22 and a write circuit for selectively pulling toward ground one of the write bit lines WR_BLT[n−1:0], WR_BLB[n−1:0] in the selected pair. The example of RAM 18 shown in FIG. 3 is constructed to an "interleaved" architecture, in which a given memory address selects one of every x (e.g., one of every four) columns for read or write access. The data words stored in memory array 20 are thus interleaved with one another, in the sense that the memory address decoded (in part) by column select circuit 22 selects one column in each group of columns, along the selected row. Alternatively, memory array 20 may be arranged in a non-interleaved fashion, in which each cell in the selected row is coupled to a corresponding read/write circuit in each cycle. In that architecture, read/write circuits 24 could reside between bit lines RD_BL[n−1:0], WR_BLT[n−1:0], WR_BLB[n−1:0] and column select circuits 22, with the column select circuits selecting which read/write circuits 24 (and thus which columns) are in communication with data bus DATA I/O.

According to embodiments of this invention, each of the memory cells in memory array 20 is constructed as an "8-T" cell, in which a two-transistor read buffer is added to the conventional "6-T" SRAM cell construction, in which four transistors constitute a latch of cross-coupled inverters, and two transistors serve as the pass transistors between corresponding storage nodes of the latch and corresponding ones of a differential bit line pair. One or both of the additional read buffer transistors are constructed to have stronger drive strength (i.e., a higher source/drain current for a given bias) than the six transistors of the latch and its pass transistors, so that the read current of the cell is increased from that which the cell transistors could provide. This stronger drive strength of the read buffer transistors is typically attained by constructing these devices with a larger channel width than that of the latch and pass transistors; other approaches toward increasing the drive strength may also or alternatively be used, including a smaller channel length and a different channel implant (to attain a lower threshold voltage).

This 8-T construction is especially attractive for use in modern integrated circuits that are constructed with deep sub-micron minimum feature size transistors. As known in the art, these extremely small transistors enable high density circuit implementation, especially for memory arrays such as described above in connection with FIG. 3, but at a cost of reduced transistor drive strength. As such, the stronger read current provided by the 8-T cell construction is attractive.

Figure 1B:
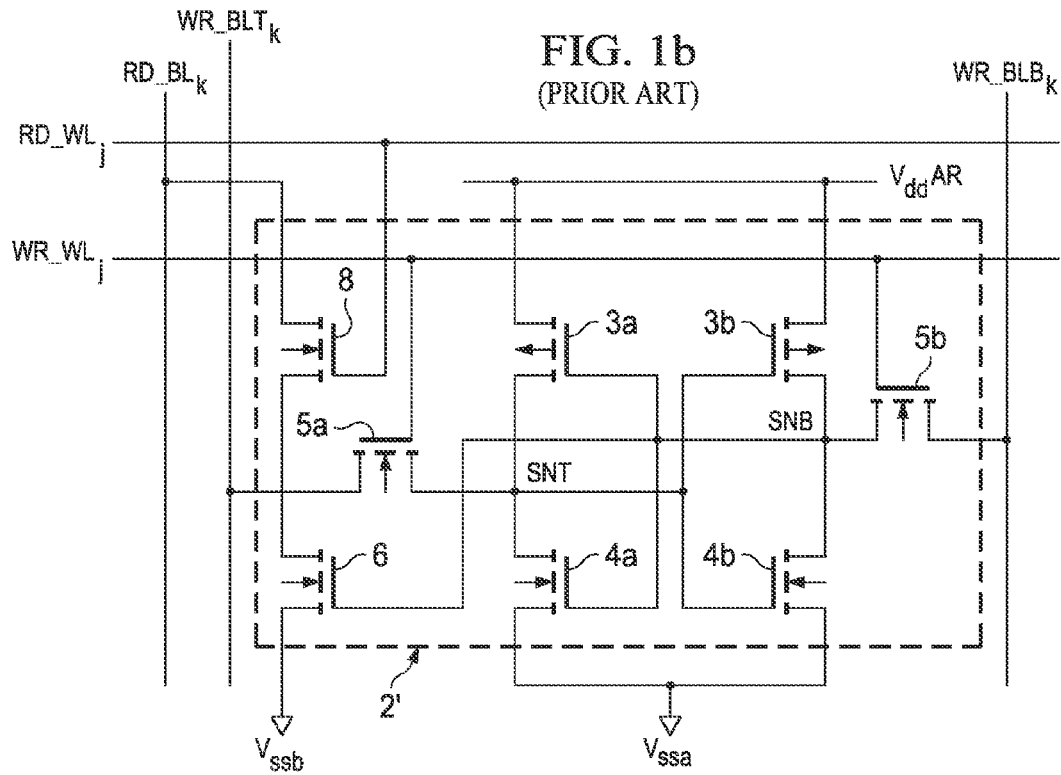

However, it has been observed, according to this invention, that the larger read buffer transistors of the 8-T cell construction cause noticeable proximity effects on the latch and pass transistors of the memory cell. Referring to the example of 8-T cell 2' of FIG. 1b, and assuming that the physical proximity of the transistors corresponds to the arrangement shown in that electrical schematic, larger read buffer transistors 6, 8 will exert a larger proximity effect on load transistor 3a, driver transistor 4a, and pass transistor 5a than on counterpart transistors 3b, 4b, 5b. It has been observed by actual measurement, according to this invention, that these proximity effects are reflected by apparent offsets in threshold voltage between counterpart transistors (i.e., transistor 3a relative to transistor 3b, transistor 4a relative to transistor 4b, and transistor 5a relative to transistor 5b). The threshold voltage offset has been observed to be most dramatic for load transistor 3a relative to load transistor 3b, although noticeable threshold voltage offsets were also exhibited between driver transistor 4a and driver transistor 4b, and between pass transistor 5a and pass transistor 5b.

According to embodiments of this invention, the memory cells in memory array 20 are constructed to compensate for these proximity effects. FIG. 4 illustrates the construction of memory cell 30, in the $j^{th}$ row and $k^{th}$ column of memory array 20, according to embodiments of this invention. In this example, memory array 20 is constructed so that all of its cells are similarly constructed as cell 30 of FIG. 4; alternatively, cell 30 may be implemented in a smaller integrated circuit function, such as a storage element in a register or configuration circuit.

Cell 30 according to embodiments of this invention is electrically arranged similarly as cell 2' described above in connection with FIG. 1b. As such, cell 30 includes a pair of cross-coupled CMOS inverters biased between the voltage on power supply line $V_{dda}$ and a ground reference voltage $V_{ssa}$. One inverter is constituted by p-channel load transistor 33a and n-channel driver transistor 34a having their source/drain paths connected in series between power supply line $V_{dda}$ and a ground reference voltage $V_{ssa}$, with their common drain nodes at storage node SNT and their gates connected together at storage node SNB. The other inverter is constituted by p-channel load transistor 33b and n-channel transistor 34b having their source/drain paths connected in series between power supply line $V_{dda}$ and a ground reference voltage $V_{ssa}$, with their common drain nodes at storage node SNB and their gates connected together at storage node SNT. N-channel pass transistor 35a has its source/drain path connected between storage node SNT and write bit line WR_BLT$_k$ for the $k^{th}$ column, and n-channel pass transistor 35b has its source/drain path connected between storage node SNB and bit line WR_BLB$_k$. The gates of pass transistors 5a, 5b are driven by write word line WR_WL$_j$ for this $j^{th}$ row in which cell 30 resides.

According to its "8-T" construction, memory cell 30 includes a two-transistor single-sided read buffer circuit constructed of n-channel MOS transistors 36, 38 with their source/drain paths connected in series between read bit line RD_BL$_k$ for column k and ground voltage $V_{ssb}$ (which may be at the same or a different voltage from array ground voltage $V_{ssa}$). The gate of transistor 36 is connected to storage node SNB, while the gate of transistor 38 is connected to read word line RD_WL$_j$, which is the word line asserted in read cycles for row j. As discussed above, transistors 36, 38 are constructed to have stronger drive strength, typically by having a larger channel width, than the typically minimum feature size transistors 33, 34, 35 in its memory cell 30.

In operation, bit lines RD_BL$_k$, WR_BLT$_k$, WR_BLB$_k$ are typically precharged by precharge circuitry 27 (FIG. 3) to voltage $V_{ddp}$ (e.g., at or near power supply voltage $V_{dda}$). Write bit lines WR_BLT$_k$, WR_BLB$_k$ may also be equalized at that voltage. Following precharge, precharge circuitry 27 releases bit lines RD_BL$_k$, WR_BLT$_k$, WR_BLB$_k$ to then float during the remainder of the access cycle. In a write operation, read/write circuitry 24 pulls one of bit lines WR_BLT$_k$, WR_BLB$_k$ low (i.e., to a voltage at or near ground voltage $V_{ssa}$), depending on the data state to be written. Upon write word line WR_WL$_j$ then being energized, the low level bit line WR_BLT$_k$ or WR_BLB$_k$ will pull down its associated storage node SNT, SNB, causing the cross-coupled inverters of addressed cell 30 to latch in the corresponding state. In a read operation, read word line RD_WL$_j$ is energized after precharge and release, turning on buffer transistor 38, which allows buffer transistor 36 to set the state of read bit line RD_BL$_k$ based on the latched level at storage node SNB. The voltage developed on read bit line RD_BL$_k$ is then sensed and amplified by read/write circuitry 24.

For purposes of this description, cell 30 is physically constructed so that load transistor 33a, driver transistor 34a, and pass transistor 35a are closer in proximity to buffer transistors 36, 38 than are the counterpart devices of load transistor 33b, driver transistor 34b, and pass transistor 35b, respectively. According to embodiments of this invention, one or more of load transistor 33a, driver transistor 34a, and pass transistor 35a (each indicated by a broken circle in FIG. 4) is constructed to have different drive strength than its counterpart load transistor 33b, driver transistor 34b, and pass transistor 35b, respectively. This difference in construction between these typically matched transistors is selected, during design of the integrated circuit layout or its manufacturing process flow, to compensate for the proximity effects exerted by transistors 36, 38 in cell 30. As a result, even though the 6-T portion of cell 30 is constructed asymmetrically, the proximity effects caused by buffer transistors 36, 38 on one side of cell 30 (but not on the other) result in cell 30 becoming electrically balanced, and exhibiting the corresponding cell stability.

It has been observed, according to this invention, that proximity effects have caused, in some cases, one or more of load transistor 33a, driver transistor 34a, and pass transistor 35a to exhibit weaker drive strength than their respective counterparts of load transistor 33b, driver transistor 34b, and pass transistor 35b. In this situation, one or more of transistors 33a, 34a, 35a are constructed to have stronger drive strength (in the absence of proximity effects) than their respective counterpart transistors 33b, 34b, 35b. Drive strength of an MOS transistor can be increased in several ways, each of which is known in the art. For example, the drive strength of a MOS transistor can be increased by increasing the "W/L" ratio of the device, either by increasing the channel width of the transistor for a given channel length, decreasing the channel length of the transistor for a given channel width, or both.

Another approach to increasing the drive strength of an MOS transistor is to reduce the net dopant concentration in the channel region underlying the transistor gate. For the example of an n-channel enhancement mode MOS transistor, reduction in the net concentration of p-type dopant in the channel region underlying the gate electrode and gate dielectric will decrease the transistor threshold voltage, which increases the source/drain current under a given bias condition (in saturation). Similarly, reduction in the n-type dopant in the channel region of a p-channel enhancement mode MOS transistor decreases the transistor threshold voltage (in absolute value terms), increasing its drive strength. Such changes in the net dopant concentration of the channel region can be accomplished by changing the dose and perhaps energy of a "threshold adjust" ion implantation into the channel region of the transistor, which is typically performed prior to formation of the gate electrode. The term "net channel dopant concentration", as used in this description, reflects that the channel region of a MOS transistor of either channel conductivity type can be implanted with either or both of p-type and n-type dopant; the threshold voltage is largely determined by the net channel dopant concentration following all such ion implant steps, considering also the initial dopant concentration of the channel region prior to such implants. For example, an eventual n-channel MOS transistor may be formed into p-type bulk silicon, or a p-well formed into the bulk silicon, with the eventual channel region receiving either or both of n-type and p-type ion implants. The net channel dopant concentration considering all of those dopant sources (starting bulk material, well implants, n-type and p-type ion implants), as well as diffusion from adjacent doped semiconductor regions, determine the threshold voltage of the eventual transistor when formed. In general, a lower net p-type channel dopant concentration in the channel region of an n-channel enhancement mode MOS transistor will mean a lower threshold voltage, and thus higher drive strength for a given bias condition. Similarly, a lower net n-type channel dopant concentration in the channel region of a p-channel enhancement mode MOS transistor will mean a lower threshold voltage (in absolute value terms), and thus higher drive strength for a given bias condition.

According to this embodiment of the invention, in which the proximity effects of buffer transistors 36, 38 weaken nearby smaller MOS transistors, particularly those of smaller size and drive strength (i.e., minimum feature size), one or more of load transistor 33a, driver transistor 34a, and pass transistor 35a is constructed to have a larger channel width, a shorter channel length, or a lower net channel dopant concentration in its channel region, or a combination thereof, than its counterpart load transistor 33b, driver transistor 34b, and pass transistor 35b, respectively. It is contemplated that the compensation of pass transistor 35a in this manner will typically be of secondary importance in embodiments of this invention, as compared with the compensation of load transistor 33a or driver transistor 34a, since any asymmetry of it relative to pass transistor 35b tends to affect cell stability to a lesser degree than does asymmetry in latch transistors 33, 34.

Figure 5A:
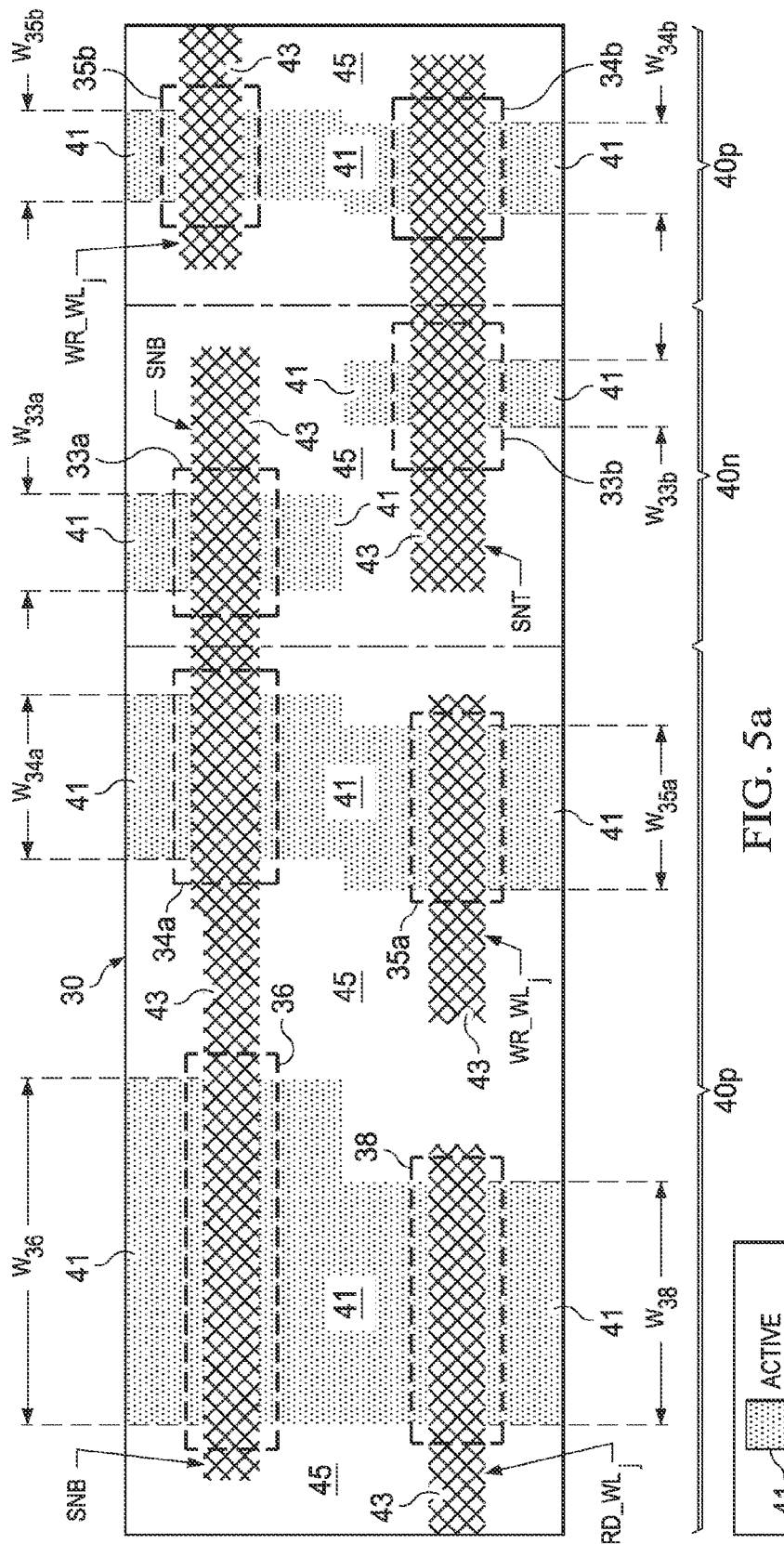
FIGS. 5a and 5b are plan views of a layout of a portion of an integrated circuit including the memory cell of FIG. 4, according to an embodiment of the invention.

FIG. 5a illustrates, in plan view, the layout of an example of cell 30 according to an embodiment of the invention in which each of load transistor 33a, driver transistor 34a, and pass transistor 35a is constructed to have a larger channel width than the respective counterparts of load transistor 33b, driver transistor 34b, and pass transistor 35b. The view of FIG. 5a includes the integrated circuit levels of active regions 41 (i.e., the surface of wells within or of bulk single-crystal silicon), gate electrodes 43 (i.e., formed of polycrystalline silicon), and isolation dielectric 45, within a single contiguous bit cell area for cell 30. As known in the art, isolation dielectric 45 is formed at selected locations of the semiconducting surface of the substrate or other body, defining active regions 41 at those locations of the surface at which isolation dielectric 45 is absent. As also known in the art, transistors (more specifically, the channel region of transistors) are defined at those locations of active regions 41 where crossed by a gate electrode 43, with active regions 41 on either side of the crossing gate electrode 43 constituting the source and drain regions of the transistor. In the view of FIG. 5a, the locations of the transistors of cell 30 of FIG. 4 are shown by dashed boxes and the associated reference numerals referring to those cell transistors. Gate electrodes 43 are shown in FIG. 5a with reference to their circuit node in the electrical schematic of FIG. 4. In this example, transistors 36, 33a, 34a share a unitary gate electrode 43 that corresponds to storage node SNB, transistors 33b, 34b share a unitary gate electrode 43 that corresponds to storage node SNT, pass transistors 35a, 35b each have a separate gate electrode connected to write word line WR_WL$_j$, and gate electrode 43 of buffer transistor 38 corresponds to read word line RD_WL$_j$. Overlying metal conductors, contact openings, and the like serving to bias and interconnect the transistors of cell 30 are not shown in FIG. 5a, for clarity. It is contemplated that those skilled in the art having reference to this specification will be readily able to comprehend the layout and construction of cell 30 according to this embodiment of the invention from the plan view of FIG. 5a, despite the limited number of levels shown.

In the plan view of FIG. 5a, the bit cell area of cell 30 is arranged with buffer transistors 36, 38 along one end of cell 30 (in the row direction, in this case), disposed within an instance of p-well 40p. N-channel driver transistor 34a and pass transistor 35a are also formed within this same instance of p-well 40, and as such are the nearest transistors in cell 30 to buffer transistors 36, 38. P-channel load transistors 33a, 34a are formed within an instance of n-well 40n adjacent to transistors 34a, 35a, with load transistor 33a nearer to those buffer transistors than to load transistor 34b. Another instance of p-well 40p is at the far end of the layout of cell 30 from buffer transistors 36, 38, and contains n-channel driver transistor 34b and pass transistor 35b. Transistors 34b, 35b are thus the transistors within the bit cell area that are farthest from buffer transistors 36, 38.

FIG. 5a illustrates the channel widths of the various transistors within the bit cell area of cell 30 according to this embodiment of the invention. As shown, buffer transistors 36, 38 have relatively wide channel widths $W_{36}$, $W_{38}$ relative to the other transistors of cell 30, and as such have greater drive strength than the other transistors, as the channel lengths of all transistors in cell 30 are approximately the same as one another. According to this embodiment of the invention, in which proximity effects caused by these larger buffer transistors 36, 38 weaken nearby transistors, the channel widths of one or more of those transistors nearer to buffer transistors 36, 38 are made larger than their counterpart transistors within cell 30. More specifically, as shown in FIG. 5a, channel width $W_{34a}$ of driver transistor 34a is substantially larger than channel width $W_{34b}$ of driver transistor 34b, channel width $W_{35a}$ of pass transistor 35a is substantially larger than channel width $W_{35b}$ of pass transistor 35b, and channel width $W_{33a}$ of load transistor 33a is substantially larger than channel width $W_{33b}$ of load transistor 33b. As mentioned above and as shown in FIG. 5a, each of transistors 33a, 34a, 35a has a larger W/L ratio and thus higher drive strength (in the absence of proximity effects) than its corresponding counterpart transistor 33b, 34b, 35b, respectively.

In contrast, in a conventional memory cell such as described above relative to FIGS. 1a and 1b, channel width $W_{34a}$ of driver transistor 34a would be equal to channel width $W_{34b}$ of driver transistor 34b, channel width $W_{35a}$ of pass transistor 35a would be equal to channel width $W_{35b}$ of pass transistor 35b, and channel width $W_{33a}$ of load transistor 33a would be equal to channel width $W_{33b}$ of load transistor 33b. But as described above, this symmetric construction would be vulnerable to asymmetric behavior (and thus reduced cell stability, among other issues) caused by the asymmetric proximity effects of buffer transistors 36, 38 on nearby transistors 33a, 34a, 35a.

As described above, additionally or alternatively to the increased channel widths shown in FIG. 5a according to this embodiment of the invention, those transistors 33a, 34a, 35a nearer to buffer transistors 36, 38 may have shorter channel lengths, or lower net channel dopant concentrations than their counterpart transistors 33b, 34b, 35b. In addition, not all of transistors 33a, 34a, 35a may be strengthened to compensate for their weakening caused by proximity effects, depending on the nature of the proximity effects and the result as evidenced by the electrical behavior of cell 30.

Also as mentioned above, if the proximity effects of large buffer transistors 36, 38 strengthen rather than weaken nearby transistors, one or more of transistors 33a, 34a, 35a in the layout of FIG. 5a would be constructed with smaller channel widths, longer channel lengths, or higher net channel dopant concentrations than their corresponding counterpart transistors 33b, 34b, 35b. It is further contemplated that the proximity effects may alter transistors of different channel conductivity type (i.e., n-type and p-type) in different directions (i.e., one is weakened while the other is strengthened), or may alter transistors of different channel orientation in the layout (i.e., vertical vs. horizontal in plan view) in different directions. In such cases, one transistor near to buffer transistors 36, 38 may be strengthened while another transistor is weakened, in order to properly compensate cell performance.

Figure 5B:
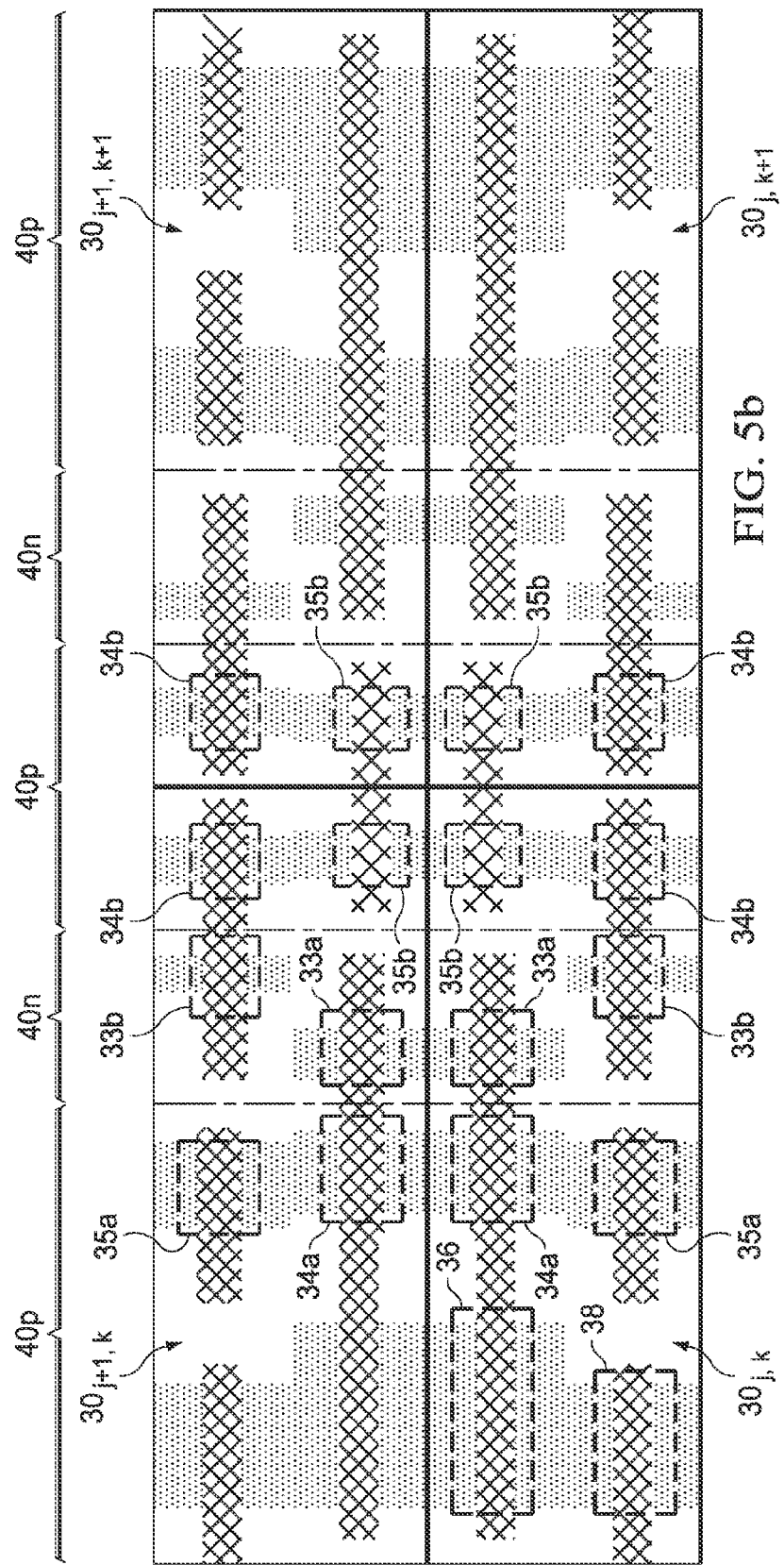

FIG. 5b illustrates, in plan view, the arrangement of multiple memory cells 30 in a portion of memory array 20, specifically a group of four similarly constructed cells $30_{j,k}$, $30_{j,k+1}$, $30_{j+1,k}$, $30_{j+1,k+1}$. In this view, the bit cell area of cell $30_{j,k}$ is oriented in the manner shown in FIG. 5a, with buffer transistors 36, 38 at its left end, and n-channel transistors 34b, 35b at its right end. In this example, the bit cell area of cell $30_{j,k+1}$ to the right of cell $30_{j,k}$, is reversed horizontally end-to-end, so that its smallest transistors 34b, 35b are adjacent to the same-sized transistors 34b, 35b of cell $30_{j,k}$. The bit cell area of cell $30_{j+1,k}$, which appears above cell $30_{j,k}$, is flipped vertically so that its transistors 33a, 35b, etc. are adjacent to the same transistors in cell $30_{j,k}$. The bit cell area of cell $30_{j+1,k+1}$, which is diagonally opposite from cell $30_{j,k}$, is both flipped vertically and reversed horizontally from cell $30_{j,k}$, so that its smallest transistors 34b, 35b are adjacent to corresponding ones of the same-sized transistors 34b, 35b of cells $30_{j,k+1}$, $30_{j+1,k}$ as shown. Additional groups of four cells 30 are placed along the sides of the group shown in FIG. 5b, in the same orientation.

The bit cell orientation of FIG. 5b, according to this embodiment of the invention, ensures that the smallest transistors 33b, 34b, 35b (e.g., of minimum feature size) are not adjacent to large buffer transistors 36, 38 in adjacent cells. Rather, the smallest transistors 33b, 34b, 35b of each cell are nearest the same-sized transistors 33b, 34b, 35b in adjacent cells, to the extent possible. Accordingly, these smallest transistors 33b, 34b, 35b are well-protected from proximity effects not only from within the same cell 30, but from adjacent cells 30 in the array.

Based on the above description, it is contemplated that those skilled in the art having reference to this specification will be readily able to implement and adapt the circuit design and layout considerations described above within the design constraints and goals of a wide range of integrated circuits, without undue experimentation.

Figure 6:
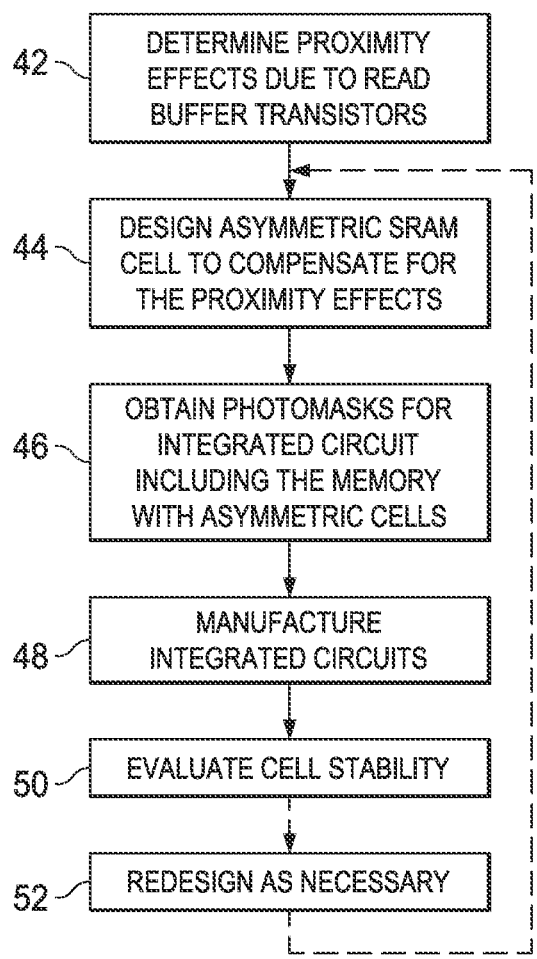
FIG. 6 is a flow diagram illustrating a process of constructing a solid-state memory according to embodiments of this invention.

Referring now to FIG. 6, the designing and manufacturing of integrated circuits including memory cells and memory arrays constructed according to embodiments of this invention will be described. It is of course contemplated that those skilled in the art having reference to this specification will be readily able to use and adapt this process as suitable and appropriate for their particular designs.

As shown in FIG. 6, this methodology begins with process 42, in which the proximity effects sought to be compensated by the construction of cell 30 are determined. Process 42 may be carried out by any one or more of a number of techniques, either individually or used in combination. For example, process 42 may be performed by way of simulation, such as by way of evaluation of a SPICE (Simulation Program with Integrated Circuit Emphasis) model of transistor behavior in which proximity effects are included. Another approach to carrying out process 42 is the manufacture and evaluation of test chips, namely test integrated circuits with transistor structures of varying sizes and varying distances from one another, from which engineering personnel can characterize proximity effects for a given manufacturing technology. Other methods of performing process 42 can include the use of information available in the literature, extrapolation of proximity effects from previously evaluated integrated circuits of different design, or based on empirical results from an integrated circuit including memories that suffer from cell instability or other performance limitations caused by proximity effects such as those described herein. It is contemplated that, following process 42, the appropriate engineering personnel will have an indication of the magnitude of the proximity effects likely to be caused by buffer transistors 36, 38 of cell 30 of the size contemplated, and of course also the polarity (i.e., strengthening or weakening) of those effects on nearby transistor.

In process 44 according to embodiments of this invention, cell 30 is designed to have asymmetric construction as described above, so that the proximity effects caused by buffer transistors 36, 38 are compensated within cell 30. Design process 44 may implement this asymmetric construction in the layout stage of circuit design, for example if one or more transistors are to have different channel width or channel length (or both) than their counterparts within the same cell 30. Alternatively or in addition, design process 44 may implement this asymmetric construction in the design of the threshold adjust ion implant dose or energy, or both, so that the threshold voltages of counterpart transistors within cell 30 are constructed to have different net channel dopant concentrations, as described above.

Following design process 44, and particularly if the asymmetry of cells 30 is implemented via layout (i.e., differences in transistor channel length or channel width), photomasks corresponding to the layout and design of integrated circuit 10 including a memory 18 with cells 30 constructed according to an embodiment of this invention are obtained in the conventional manner, in process 46. As will be appreciated by those skilled in the art having reference to this specification, those photomasks will correspond to a layout such as shown by way of example in FIGS. 5a and 5b, for that embodiment of the invention, such photomasks defining not only the physical layout of particular structures, but also defining those locations that receive the various masked ion implants, such as used in adjusting the threshold voltage of transistors in cells 30.

Integrated circuits 10 using those photomasks are manufactured in process 48, according to the appropriate MOS technology (with threshold adjust implants asymmetrically applied to transistors within cell 30 as may have been designed in process 44, as mentioned above). Manufacturing process 48 thus forms the transistors within cell 30 according to the results of design process 44, and interconnections among those transistors (e.g., in metal conductors disposed over those transistors) to complete the electrical circuit of cell 30 (e.g., according to the schematic diagram of FIG. 4) specifically, and integrated circuit 10 generally, in the manner known in the art. Manufacturing process 48 and the resulting integrated circuit corresponds (at least in part) to the photomasks obtained in process 46, and also corresponds to the applicable manufacturing process flow and parameters. It is contemplated that those skilled in the art having reference to this specification will comprehend the manner in which manufacturing process 48 is carried out, according to embodiments of this invention, for the appropriate MOS technology without undue experimentation.

In process 50, integrated circuits 10 manufactured in process 48 are evaluated electrically, both to characterize or otherwise measure the performance of individual cells 30 and RAM 18 within each integrated circuit 10, but also in most cases to identify actual or potential test yield issues caused by less than optimal compensation for proximity effects within cells 30 by the current results of design process 44. For example, if too much or too little compensation has resulted from the particular construction of cells 30 according to design process 44, cells 30 may exhibit inadequate cell stability or may present other weaknesses (e.g., read current, write current, disturb or retention performance, power consumption, or the like). If such is determined to be the case from process 50, optional process 51 may be carried out to redesign the layout or threshold adjust implants for one or more of the transistors in cells 30. Typically, it is preferred to fine-tune the compensation provided by embodiments of this invention by adjusting the threshold adjust implant dose or energy (or both) applied asymmetrically to transistors within cells 30, rather than change the overall cell layout, which of course requires new photomasks. Upon obtaining adequate cell stability and memory performance, the method of FIG. 6 according to embodiments of the invention is complete.

Embodiments of this invention thus provide important advantages and benefits over conventional integrated circuit memories, particularly in connection with memory cells that include an asymmetric feature such as a large drive buffer. In particular, embodiments of this invention enable the resulting memory cells to maintain electrical balance despite the proximity effects that can be caused by such asymmetric features. These proximity effects can be especially apparent in modern deep sub-micron cell transistors, but can be fully addressed by the compensation provided by this invention. It is therefore contemplated that this invention can improve the stability and performance of a wide range of memory cell designs that would otherwise be vulnerable to asymmetric contexts within or nearby to those memory cells, enabling the implementation of such memories with minimum feature size transistors while still sourcing strong read currents and write performance. In particular, memory cells can be constructed with minimum feature size devices for the storage function, while enabling the use of larger and thus stronger buffer circuits within the cell, without suffering from proximity effects otherwise caused by those buffer devices. It is contemplated that embodiments of the invention are also applicable in memory cells having buffer transistors that are substantially smaller than its latch transistors or pass transistors.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating a memory in an integrated circuit, comprising the steps of:
    forming first and second transistors within each of a plurality of adjacent bit cell areas at a semiconducting surface;
    forming one or more buffer circuit transistors within each of the bit cell areas, the one or more buffer circuit transistors having features larger than corresponding features of the first and second transistors, the first and second transistors and buffer circuit transistors arranged in the bit cell area so that the first transistor is disposed within its bit cell area between the buffer circuit transistors and the second transistor of that bit cell area;
    forming interconnections among the first and second transistors and buffer circuit transistors within each bit cell to define first and second cross-coupled inverters, the first inverter including the first transistor and the second inverter including the second transistor, an output of one of the first and second inverters coupled to the buffer circuit transistors;
    wherein the second transistors in first and second adjacent bit cell areas are disposed adjacent one another;
    wherein the buffer circuit transistors in first and third adjacent bit cell areas are disposed adjacent one another;
    and wherein the forming steps form the first transistor in each bit cell area to differ from the second transistor in its bit cell area in one or more physical attribute selected from the group consisting of channel width, channel length, and net channel dopant concentration.

2. The method of claim 1, wherein the output of the second inverter is coupled to the buffer circuit transistors.

3. The method of claim 1, further comprising:
    determining differences in electrical characteristics resulting from proximity of features corresponding to the buffer circuit transistors upon transistors at varying distances in the semiconducting surface from those features; and
    from the determined differences in electrical characteristics, selecting a design difference in one or more physical attributes of the first transistor, relative to the second transistor, selected from the group consisting of channel width, channel length, and net channel dopant concentration.

4. The method of claim 3, wherein the determining step determines that the buffer circuit transistors reduce source/drain drive strength of transistors at closer distances thereto;
    and wherein the first transistor in each bit cell area is constructed to have, relative to the second transistor in that bit cell area, one or more of the attributes selected from the group consisting of a larger channel width, a shorter channel length, and a lower net channel dopant concentration.

5. The method of claim 3, wherein the determining step determines that the buffer circuit transistors increase source/drain drive strength of transistors at closer distances thereto;
    and wherein the first transistor in each bit cell area is constructed to have, relative to the second transistor in that bit cell area, one or more of the attributes selected from the group consisting of a smaller channel width, a longer channel length, and a higher net channel dopant concentration.

* * * * *